United States Patent [19]

Desbois

[11] Patent Number: 4,916,416
[45] Date of Patent: Apr. 10, 1990

[54] METHOD FOR THE CORRECTION OF A SURFACE WAVE DEVICE, ESPECIALLY FOR A REFLECTIVE ARRAY COMPRESSOR

[75] Inventor: Jean Desbois, Roquefort Les Pins, France

[73] Assignee: Thomson-CSF, Paris, France

[21] Appl. No.: 167,714

[22] Filed: Mar. 14, 1988

[30] Foreign Application Priority Data

Mar. 19, 1987 [FR] France .................................. 87 03838

[51] Int. Cl.⁴ ............................................... H04H 3/10
[52] U.S. Cl. ..................................... 333/195; 333/193; 333/196; 310/313 B; 310/313 C
[58] Field of Search ................................. 333/193–196, 333/153, 155; 310/313 R, 313 B, 313 C

[56] References Cited

U.S. PATENT DOCUMENTS

| | | | |
|---|---|---|---|
| 3,393,383 | 7/1968 | Chiron et al. | 333/240 |
| 3,659,231 | 4/1972 | De Vries | 333/194 |
| 3,663,899 | 5/1972 | Dieulesaint et al. | 333/166 |
| 4,044,321 | 8/1977 | Vasile | 310/313 C X |
| 4,327,340 | 4/1982 | Coldren | 333/195 |
| 4,460,995 | 7/1984 | Devries | 310/313 R |
| 4,468,642 | 8/1984 | Hikita | 333/195 X |
| 4,639,697 | 1/1987 | Yarranton et al. | 333/155 |
| 4,661,923 | 4/1987 | Grudkowski et al. | 333/150 X |
| 4,730,172 | 3/1988 | Bengeult | 333/240 X |
| 4,857,870 | 8/1989 | Gautier et al. | 333/195 |

FOREIGN PATENT DOCUMENTS

2346899 10/1977 France .
2591049 6/1987 France .
8703756 6/1987 France .

OTHER PUBLICATIONS

Telecommunications & Radio Engineering, vol. 34/35, No. 5, May 1980, pp. 62–67, Scripta Publishing Co., Silver Spring, Md., U.S.; E. E. Znamenskiy et al.: "Features of the Construction of Narrowband Filters For Acoustic Surface Waves".

Primary Examiner—Eugene R. Laroche
Assistant Examiner—Seung Ham
Attorney, Agent, or Firm—Oblon, Spivak, McClelland, Maier & Neustadt

[57] ABSTRACT

A method for the correction of surface wave devices consists of measuring the transfer function of an entirely finished surface wave device and then designing a surface wave corrective filter, the transfer function of which enables the correction of the transfer function of the preceding device. The method makes it possible to correct, in particular, RAC type dispersive filters.

11 Claims, 2 Drawing Sheets

METHOD FOR THE CORRECTION OF A SURFACE WAVE DEVICE, ESPECIALLY FOR A REFLECTIVE ARRAY COMPRESSOR

BACKGROUND OF THE INVENTION

1. Field of the Invention

The present invention relates to methods for correcting faults that appear in the manufacture of surface wave devices, especially reflective array compressors (RACs) that make use of the reflection of sound waves on variable-pitch arrays, inclined with respect to the direction in which these sound waves are propagated.

In these reflective array compressors, the product of the pass-band and signal time (called BT) of these filters is very great, which gives them their value.

2. Description of the Prior Art

An RAC, corresponding to the state of the art, is shown in FIG. 1. It has a piezoelectrical substrate 1, an interdigitated emission transducer 10 which, from the signal to be compressed, sends a sound wave towards a first reflecting array 100. This array has a series of gaps, in the form of lines that are inclined by substantially 45° with respect to the propagation axis Z of the sound wave. These gaps, as well as the transducer 10 and the transducer 11 which shall be referred to further below, are formed by etching or metallization on the surface of the substrate.

The sound wave is reflected by the array 100, at substantially 90°, towards a second array 110 which is identical to the first array but is symmetrical with the axis Z. The sound ave is then reflected at substantially 90° on this second array, and then sets off again in the direction opposite to the axis Z.

It is then collected by an output transducer 11 which it excites to give an output electrical signal.

The spacing between the gaps in the two reflecting arrays varies according to the distance from the input and output transducers. Thus, the reflective capacity varies with the frequency and, depending on this frequency, the sound wave will travel on a path such as 12. The length of this path and, hence, the time taken to travel on it, will depend on the frequency.

The total transfer function of this device corresponds to the product of the transfer functions of the input and output transducers and the transfer function of the reflective arrays, and gives rise to a compression of the pulse applied to the input transducer.

A device of this type does not directly give the exact amplitude and phase response sought in the useful band. This is because of various unwanted phenomena including, in particular, manufacturing defects and deformations of the piezoelectric substrate when it is being packaged.

In a known corrective method, though only for phase error, a conductive film of variable thickness and width is deposited between the two reflective arrays 100 and 110 to modify the propagation speed for each path of the waves and, therefore, for each frequency. However, this method cannot be used to correct errors that vary quickly with the frequency.

Furthermore, there are still the errors caused by the deformation of the piezoelectric substrate when it is being packaged.

SUMMARY OF THE INVENTION

In order to correct all these errors to the maximum extent, the invention proposes a method in which the frequency response characteristic of the RAC is measured once this device is completely finished, i.e. after it has been encapsulated, a surface wave corrective filter is associated with it, said corrective filter being mounted in a separate package and having a frequency response characteristic which has been determined to correct the errors of the RAC. As an alternative, the RAC and corrective filter may be used at different temperatures.

BRIEF DESCRIPTION OF THE DRAWINGS

Other specific features and advantages of the invention will appear clearly from the following description, which is given as a non-restrictive example and is made with reference to the appended figures, of which.

DESCRIPTION OF A PREFERRED EMBODIMENT

Figure 2:
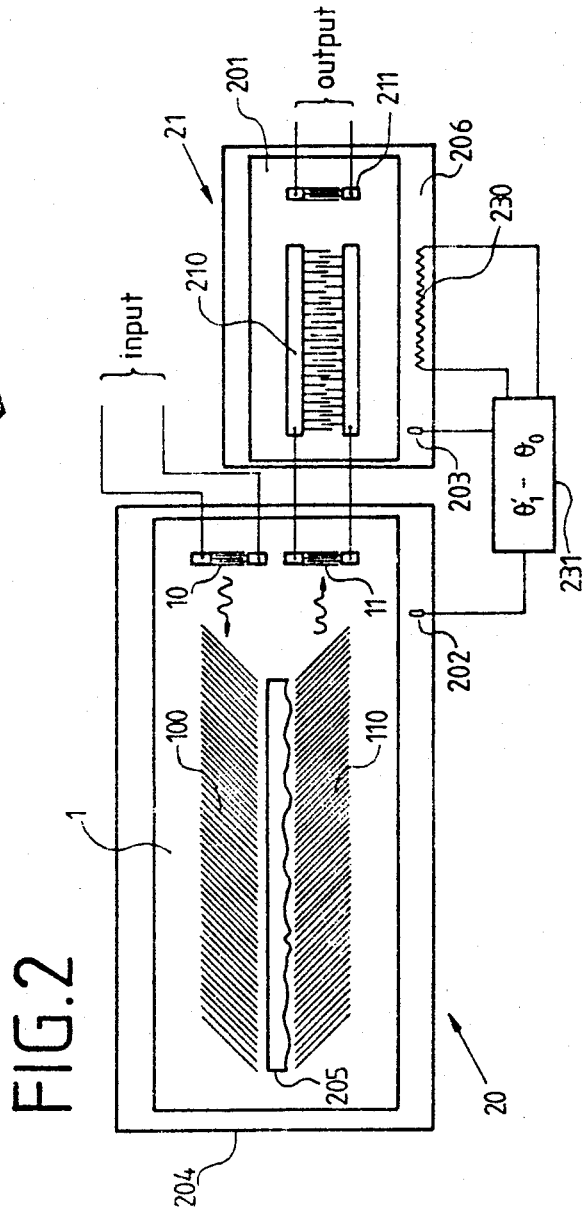
FIG. 2 shows an RAC corrected by the method of the invention.

FIG. 2 shows a RAC corrected by the method of the invention.

Figure 1:
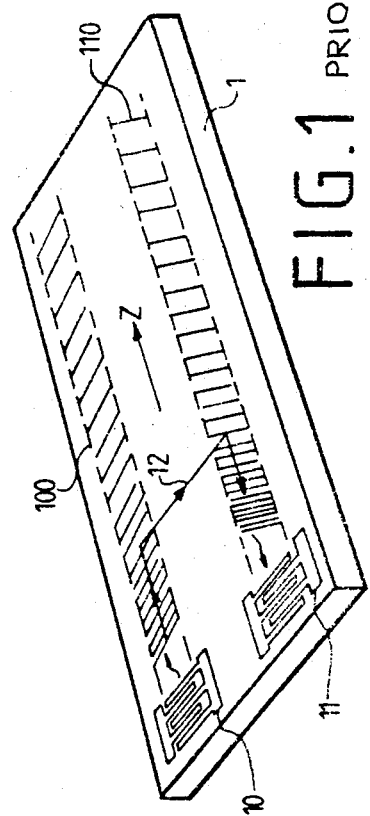
FIG. 1 shows a prior art RAC.

The RAC 20 to be corrected, like that of FIG. 1, has the following elements on a substrate 1: an input transducer 10, two reflective arrays 100 and 110 and one output transducer 11. It further has, in a known way, a metallization 205, located between the reflective arrays 100 and 110. The width of this metallization 205 is variable to correct the phase errors of the RAC at least partially. This RAC is mounted definitively in a package 204 which is then closed and which provides a number of disturbances due to the mechanical stresses that it exerts on the substrate 1. These stresses are essentially due to the fact that the RAC is a device of relatively great length and its fixing in the package causes stresses of this kind.

With this RAC completed in this way, its transfer function $H^M(f)$, in both amplitude and phase, is measured within the range of temperature at which it is planned to make the RAC work.

Since the transfer function to be obtained $H_c(f)$ is known without error, the transfer function $H(f)$ of the filter, which will make it possible to correct the errors of the RAC, is calculated by simple division. This calculation is done preferably at the nominal temperature $O_O$ at which the RAC will be made to work.

We therefore get:

$$H(f) = H_c(f)/H_M(f)$$

A surface wave corrective filter 21 is then made according to known techniques. In the example shown, this filter 21 has, on the substrate 201, an input transducer 210 made up of two interdigitated combs, the teeth of which have a variable overlapping length, and a non-weighted output transducer 211. The method for obtaining a filter of this type, using its transfer function, is known from the French patent 2 040 881 filed by the Applicant on 16th Apr. 1969. The precision with which this method is implemented is presently such that the performance of the filter obtained shows considerably fewer residual errors than those that have to be corrected in the RAC.

According to one embodiment, the two transducers of the corrective filter have teeth of variable length, and a surface sound wave coupler is placed between these transducers.

In the embodiment shown in FIG. 2, the output transducer of the RAC is connected to the weighted input transducer of the filter, and the non-weighted transducer of this filter is the output transducer of the entire unit.

This type of connection is in no way obligatory since the product of the transfer functions of the RAC and the transfer functions of the filter is interchangeable. Hence, for example, the corrective filter can be placed upstream of the RAC. The weighted transducer can also be used as an output transducer of the corrective filter.

The corrective filter has a package 206 in which the substrate 201, including the transducers, is placed. This package is then closed.

The stresses given by the package 206 to the corrective filter have a far smaller influence than those given by the package 204 to the RAC, in particular because the dimensions of the RAC package are considerably greater than those of the corrective filter package. Experience has shown that the disturbances due to this influence in the filter are negligible when compared with the correction given by this filter and that the use of this filter really meets the goal aimed at.

When designing the corrective filter, a working temperature of the filter $O_1$ is selected along with a speed of the sound waves, on the substrate surface, corresponding to this temperature. It is observed, after making the filter, that various inevitable variations, such as variations in the thickness of the metallizations and the difference in the width/spacing ratio of the teeth, cause a homothetical frequency shift in the transfer function of the filter. This shift can be analyzed essentially as a difference in the speed of the sound waves. This difference is most often in the range of $10^{-4}$. If the observed deterioration in performance is acceptable, the corrective filter is made to work at the same temperature as the RAC and, for this, the two packages are mounted in close thermal contact so that only one thermostat is used for the entire unit.

If, on the contrary, the deterioration in performance due to this difference is unacceptable, the corrective filter is made to work at a temperature different from the one chosen when designing it in order to compensate for the speed difference. For this, two thermostats are used: one stabilizing the RAC at a temperature of $\theta_0$ and the other stabilizing the corrective filter at a temperature $\theta'_1$ needed to obtain the desired performance. Two thermometrical probes, 202 and 203, are used to measure the temperatures of the RAC package 204 and the corrective filter package 206 respectively. To avoid accumulating the errors of these two thermostats, preferably one thermostat common to both packages is used, along with means to adjust the temperature of the package 206 with respect to that of the package 204. In the figure, these adjusting devices are shown by a measuring and monitoring device 231 which measures the temperature difference $\theta'_1 - \theta_0$ and controls the adjusting of the temperature $\theta'_1$ by means of an electrical resistor 230.

As a rule, an RAC is purely dispersive. However, in certain cases, it is necessary to apply a weighting relationship to the output signal of a RAC of this type. According to an alternative embodiment of the invention, the corrective filter is used not only to correct the errors of the RAC but also to apply a weighting relationship of this type. If $H_p(f)$ is the weighting relationship, the filter is designed so as to obtain a total transfer function of this filter $H_T(f)$ equal to $H_p(f) \times H(f)$.

If several distinct weighting relationships have to be used, several corrective filters are used, and these are switched over to the RAC output as required.

Figure 3:
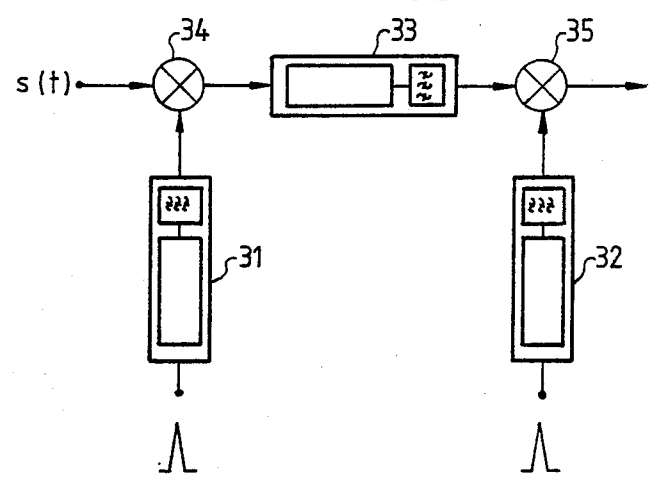
FIGS. 3 and 4 show spectrum analyzers using RACs of this type.

RACs corrected in this way are especially useful for the spectrum analysis of a signal using three dispersive lines in well known assemblies which apply, analogically, the so-called chirp transform algorithm. The assembly used is either a $\pi$ assembly shown in FIG. 3 or a T assembly shown in FIG. 4.

The $\pi$ assembly has three RACs, 31 to 33, corrected according to the invention. The RAC 31 supplies a mixer 34 which also receives the signal s(t) to be analyzed. This mixer is connected to the RAC 33, the output of which is itself connected to another mixer 35 which also receives the output of he RAC 32. The output signal of this mixer 35 represents the spectrum sought. The RACs 31 and 32 receive a brief analysis pulse.

Figure 4:
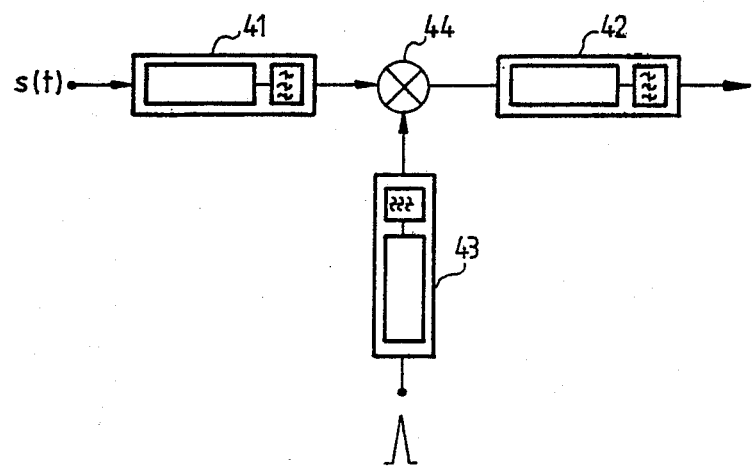

In the T assembly of FIG. 4, the signal s(t) is applied to a RAC 41. A mixer 44 receives the output signal of this RAC 41 and that of a RAC 43. A third RAC 42 receives the output signal from the mixer 44 and gives the desired spectrum. The RAC 43 receives the same analysis pulse as the RACs 31 and 32.

Each of the three RACs of these two assemblies is provided with a corrective filter according to the invention.

Although the invention has been described with respect to the correction of a RAC, its scope extends to the correction of any surface wave device.

What is claimed is:

1. A method for implementing frequency response corrections of a surface acoustic wave device, comprising the steps of:
    determining a desired transfer function of said surface acoustic wave device and determining a deviation from the desired transfer function, said surface acoustic wave device being enclosed in a package;
    designing a surface acoustic wave corrective filter, a transfer function of said corrective filter making adjustments to the measured transfer function of said surface acoustic wave device based on said deviation such that the desired transfer function is obtained;
    manufacturing said corrective filter; and
    connecting in series said surface acoustic wave device and said corrective filter; and
    wherein the received transfer function is determined by the structure of said surface acoustic wave device.

2. A method according to claim 1, wherein:
    a product of the transfer function of the surface acoustic wave device for which a correction is to be made and the transfer function of the corrective filter is equal to the desired transfer function.

3. A method according to claim 1 wherein, during the step for designing the corrective filter, a weighting relationship is also applied to the transfer function of the corrective filter.

4. A method according to claim 3, wherein:
    several corrective filters are designed, each of said several corrective filters having a separate weighting relationship, and each corrective filter being connected in series with a corresponding surface wave device.

5. A method according to claim 4 wherein:
each corrective filter and corresponding surface wave device are interfaced with other corrective filters and corresponding surface wave devices so as to form a π assembly.

6. A method according to claim 4, wherein:
each corrective filter and corresponding surface wave device are interfaced with other corrective filters and corresponding surface wave devices so as to form a T assembly.

7. A method for implementing frequency response corrections of a surface acoustic wave device, comprising the steps of:
determining a desired transfer function of said surface acoustic wave device;
measuring a transfer function of said surface acoustic wave device and determining a deviation from the desired transfer function, said surface acoustic wave device being enclosed in a package;
designing a corrective filter, a transfer function of said corrective filter making adjustments to the measured transfer function of said surface acoustic wave device based on said deviation such that the desired transfer function is obtained;
manufacturing said corrective filter; and
connecting in series said surface acoustic wave device and said corrective filter; and
maintaining said surface acoustic wave device and said corrective filter at the same temperature.

8. A method according to claim 7, wherein:
the package enclosing the surface wave device is in thermal contact with a package enclosing the corrective filter, a monitoring device connecting to and thermally controlling the package enclosing the surface wave device and the package enclosing the corrective filter.

9. A method according to claim 8, wherein:
the package enclosing the surface acoustic wave device is kept at a first temperature and the package enclosing the corrective filter is kept at a second temperature which is different from the first temperature, the difference between these two temperatures being used to obtain the desired transfer function.

10. A method according to claim 9 wherein a differential thermostat is used to adjust the second temperature with respect to the first.

11. A method according to claim 3 wherein:
said surface acoustic device is a reflective array compressor.

* * * * *